(12) United States Patent
Zhong et al.

(10) Patent No.: US 10,276,750 B2
(45) Date of Patent: Apr. 30, 2019

(54) BONDING ELECTRODE STRUCTURE OF FLIP-CHIP LED CHIP AND FABRICATION METHOD

(71) Applicant: XIAMEN SANAN OPTOELECTRONICS TECHNOLOGY CO., LTD., Xiamen (CN)

(72) Inventors: Zhibai Zhong, Xiamen (CN); Lixun Yang, Xiamen (CN); Jinjian Zheng, Xiamen (CN); Chia-en Lee, Xiamen (CN); Chen-ke Hsu, Xiamen (CN); Junyong Kang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/859,543

(22) Filed: Dec. 31, 2017

(65) Prior Publication Data
US 2018/0145220 A1 May 24, 2018

Related U.S. Application Data

(63) Continuation of application No. PCT/CN2016/111662, filed on Dec. 23, 2016.

(30) Foreign Application Priority Data

Jan. 18, 2016 (CN) .......................... 2016 1 0030189

(51) Int. Cl.
*H01L 33/36* (2010.01)
*H01L 21/02* (2006.01)
(Continued)

(52) U.S. Cl.
CPC ............ *H01L 33/36* (2013.01); *H01L 21/022* (2013.01); *H01L 21/02252* (2013.01);
(Continued)

(58) Field of Classification Search
CPC ......... H01L 33/36; H01L 33/00; H01L 33/08; H01L 33/38; H01L 21/02252
See application file for complete search history.

(56) References Cited

U.S. PATENT DOCUMENTS

| | | | | |
|---|---|---|---|---|
| 2009/0159899 | A1* | 6/2009 | Chen ....................... | H01L 33/20 257/79 |
| 2010/0038053 | A1* | 2/2010 | Maxik ...................... | F21K 9/00 165/80.2 |
| 2010/0051972 | A1* | 3/2010 | Chen ................... | H01L 25/0753 257/88 |

FOREIGN PATENT DOCUMENTS

| | | |
|---|---|---|
| CN | 103325905 A | 9/2013 |
| CN | 101859861 | * 10/2013 |
| CN | 204088359 U | 1/2015 |

* cited by examiner

*Primary Examiner* — Walter H Swanson
(74) *Attorney, Agent, or Firm* — Syncoda LLC; Feng Ma

(57) ABSTRACT

A bonding electrode structure of a flip-chip LED chip includes: a substrate; a light-emitting epitaxial layer over the substrate; a bonding electrode over the light-emitting epitaxial layer, wherein the bonding electrode structure includes a metal laminated layer having a bottom layer and an upper surface layer from bottom up. The bottom layer structure is oxidable metal and the side wall forms an oxide layer. The upper surface layer is non-oxidable metal. The bonding electrode structure has a main contact portion, and a grid-shape portion surrounding the main contact portion in a horizontal direction. The problems during packaging and soldering of the flip-chip LED chip structure, such as short circuit or electric leakage, can thus be solved.

20 Claims, 3 Drawing Sheets

(51) Int. Cl.
  *H01L 23/00* (2006.01)
  *H01L 33/08* (2010.01)
  *H01L 33/40* (2010.01)
  *H01L 33/62* (2010.01)
(52) U.S. Cl.
  CPC .............. H01L 24/04 (2013.01); H01L 24/13 (2013.01); H01L 24/16 (2013.01); H01L 33/08 (2013.01); H01L 33/40 (2013.01); H01L 33/62 (2013.01); *H01L 24/81* (2013.01); *H01L 2224/0554* (2013.01); *H01L 2224/10145* (2013.01); *H01L 2224/13011* (2013.01); *H01L 2224/13012* (2013.01); *H01L 2224/13016* (2013.01); *H01L 2224/13078* (2013.01); *H01L 2224/13082* (2013.01); *H01L 2224/13124* (2013.01); *H01L 2224/13139* (2013.01); *H01L 2224/13147* (2013.01); *H01L 2224/13562* (2013.01); *H01L 2224/13578* (2013.01); *H01L 2224/13644* (2013.01); *H01L 2224/13669* (2013.01); *H01L 2224/13671* (2013.01); *H01L 2224/13686* (2013.01); *H01L 2224/1607* (2013.01); *H01L 2224/16238* (2013.01); *H01L 2224/81193* (2013.01); *H01L 2933/0016* (2013.01); *H01L 2933/0066* (2013.01)

BONDING ELECTRODE STRUCTURE OF FLIP-CHIP LED CHIP AND FABRICATION METHOD

CROSS-REFERENCE TO RELATED APPLICATIONS

The present application is a continuation of, and claims priority to, PCT/CN2016/111662 filed on Dec. 23, 2016, which claims priority to Chinese Patent Application No. 201610030189.8 filed on Jan. 18, 2016. The disclosures of these applications are hereby incorporated by reference in their entirety.

BACKGROUND

Light-emitting diode (LED), due to remarkable advantages such as long service life, energy saving and environment protection, is deemed as another lighting technology reform after incandescent light bulb and fluorescent lamp. It has attracted great interests from the research and development of the international semiconductor and lighting field, and became an industrial focus with huge application prospects.

SUMMARY

The inventors of the present disclosure have recognized that, for LED chips with sapphire, AlN and other insulating substrates, thermal conductivity of the substrates is low, resulting in high temperature of PN junctions in lateral LEDs. To solve heat dissipation, a flip-chip structure (FC-LED) with improving Light-emitting efficiency is proposed. However, in a flip-chip design, due to restricted sizes and positions of the P and N metal electrodes, patch reflow soldering of flip chip has become an industrialized packaging method. However, common solder paste soldering during packaging is likely to cause uneven distribution of solder paste and squeezing out solder paste from the bonding pad area; if the chip electrode solder is extruded, it may cause abnormities like poor circuit and electric leakage.

The present disclosure is to provide a bonding electrode structure of a flip-chip LED chip and fabrication method thereof, which solves known problems during packaging and soldering of flip-chip LED chip structures, such as short circuit or electric leakage.

According to a first aspect of the present disclosure, a bonding electrode structure of a flip-chip LED chip is provided, wherein the bonding electrode structure has a metal laminated layer including a bottom layer and an upper surface layer from bottom to up at vertical direction, wherein the bottom layer structure is oxidable metal and the side wall forms an oxide layer, and the upper surface layer is non-oxidable metal; and the bonding electrode structure is divided into a main contact portion and a grid-shape portion surrounding the main contact portion at horizontal direction.

In some embodiments, the side wall of the bottom layer structure of the bonding electrode forms an oxide layer, which extends the solder paste downwards to the packaging electrode due to poor adhesiveness to the solder paste surface and high surface tension during packing of the flip-chip LED; this prevents the solder paste from extending to the LED chip end, thus avoiding chip electric leakage and short circuit and improving reliability;

In some embodiments, the upper surface layer of the main contact part is used for contact conduction and heat dissipation;

In some embodiments, the side wall of the electrode bottom structure in the grid-shape portion forms an oxide layer, serving as a barrier wall of the solder paste for packaging;

In some embodiments, at least 4 electrodes are provided in the grid-shape portion;

In some embodiments, the electrode pattern in the grid-shape portion can be rectangle, square, circular, oval, rectangle, polygon, cross or any of their combinations;

In some embodiments, the grid-shape portion is distributed to surround a side or each side of the main contact portion;

In some embodiments, the non-oxidable metal can be Al, Ag, Cu or any of their combinations;

In some embodiments, the oxidable metal can be Cr, Pt, Au or any of their combinations.

According to a second aspect of the present disclosure, a fabrication method for the bonding electrode structure of a flip-chip LED chip is provided, which includes:

First, fabricating a metal laminated layer, including a bottom layer and an upper surface layer from bottom to up at vertical direction, wherein, the bottom layer structure is oxidable metal and the upper surface layer is non-oxidable metal; and dividing the bonding electrode structure into a main contact portion and a grid-shape portion surrounding the main contact portion at horizontal direction;

Next, taking $O_2$ plasma pretreatment for the metal laminated layer, wherein, the upper surface layer is not prone to oxidation, and $O_2$ plasma cleans the upper surface layer to improve surface activity, thus forming good contact; and the bottom layer is oxidable metal, and the side wall of the bottom layer forms an oxide layer after $O_2$ plasma pretreatment.

In some embodiments, the side wall of the bottom layer structure of the bonding electrode forms an oxide layer, which extends the solder paste downwards to the packaging electrode due to poor adhesiveness to the solder paste surface and high surface tension during packing of the flip-chip LED; this prevents the solder paste from extending to the LED chip end, thus avoiding chip electric leakage and short circuit and improving reliability.

In some embodiments, the upper surface layer of the main contact part is used for contact conduction and heat dissipation.

In some embodiments, the side wall of the electrode bottom layer structure in the grid-shape portion forms an oxide layer, serving as a barrier wall of the solder paste for packaging;

In some embodiments, at least 4 electrodes are provided in the grid-shape portion;

In some embodiments, the electrode pattern in the grid-shape portion can be rectangle, square, circular, oval, rectangle, polygon, cross or any of their combinations;

In some embodiments, the grid-shape portion is distributed to surround a side or each side of the main contact portion;

In some embodiments, the oxidable metal can be Al, Ag, Cu or any of their combinations;

In some embodiments, the non-oxidable metal can be Cr, Pt, Au or any of their combinations.

According to a third aspect of the present disclosure, a flip-chip LED chip is provided, which includes: a light-emitting epitaxial layer including a first semiconductor layer, a second semiconductor layer and a quantum well layer between these two layers, a P electrode over the second semiconductor layer and an N electrode over the first semiconductor layer, wherein: the P electrode and the N electrode structures in the flip-chip LED chip structure are set as the aforesaid bonding electrode structure.

In some embodiments, spacing between the P electrode and the N electrode is larger than the transverse distance of the P electrode or the N electrode.

In some embodiments, transverse distance of the P electrode and the N electrode is less than 100 µm.

In some embodiments, spacing between the P electrode and the N electrode is larger than 100 µm.

Compared with existing technologies, the electrode structure design of the flip-chip LED chip according to some embodiments of the present disclosure can have one or more of the following technical effects:

(1) The upper surface layer of the main contact part is used for contact conduction and heat dissipation; and the side wall of the electrode bottom layer structure in the grid-shape portion forms an oxide layer, serving as a barrier wall of the solder paste for packaging;

(2) The side wall of the bottom layer structure of the bonding electrode forms an oxide layer through $O_2$ plasma pretreatment, which extends the solder paste downwards to the packaging electrode due to poor adhesiveness to the solder paste surface and high surface tension during packing of the flip-chip LED; this prevents the solder paste from extending to the LED chip end, thus avoiding chip electric leakage and short circuit and improving reliability.

(3) Spacing between the P electrode and the N electrode in the bonding electrode structure is larger than the transverse distance of the P electrode or the N electrode; small transverse distance of the electrode saves electrode material, causing the solder paste for packing of the flip-chip LED less likely to be squeezed out; and large spacing decreases the chance for mutual diffusion and merging of solder pastes at both sides of the P electrode and the N electrode, and therefore is unlikely to cause short circuit or electric leakage.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

Figure 1:
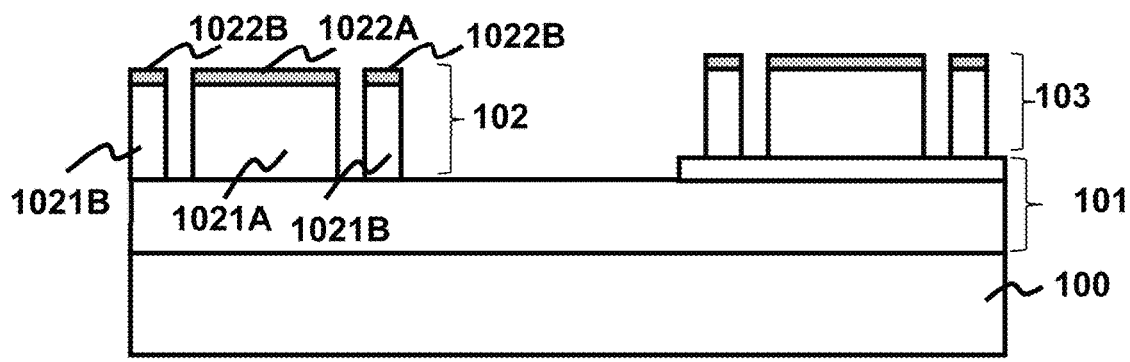
FIG. 1 illustrates a sectional views of a flip-chip LED chip structure according to some embodiments of the present disclosure.

In the drawings: 100: substrate; 101: light-emitting epitaxial layer; 102: P electrode; 103: N electrode; 1021A: bottom structure of the main contact portion of the N electrode; 1022A: upper surface layer of the main contact portion of the N electrode; 1021B: bottom structure of the grid-shape portion of the N electrode; 1022B: upper surface layer of the grid-shape portion of the N electrode; 103: P electrode; 104: oxide layer; 105: solder paste; 106: packaging electrode; 107: packaging substrate; W1: electrode spacing; W2: transverse distance.

DETAILED DESCRIPTION

Detailed steps and compositions will be described below for a better understanding of the present disclosure. In addition, it should be noted that well-known compositions or steps are not included to avoid unnecessary limitation to this present disclosure. Preferred embodiments of the present disclosure will be described in detail below. However, in addition to these details, the present disclosure can be widely applied to other embodiments. The scope of the present disclosure is not limited and is as defined by the appended claims.

The present disclosure provides a bonding electrode design suitable for the flip-chip LED chip, which solves known problems during packaging and soldering of flip-chip LED chip structures such as short circuit or electric leakage without changing the packaging substrate. Various embodiments of the bonding electrode structure and the flip-chip LED chip of the present disclosure will be described in detail with reference to the accompanying drawings.

Figure 2:
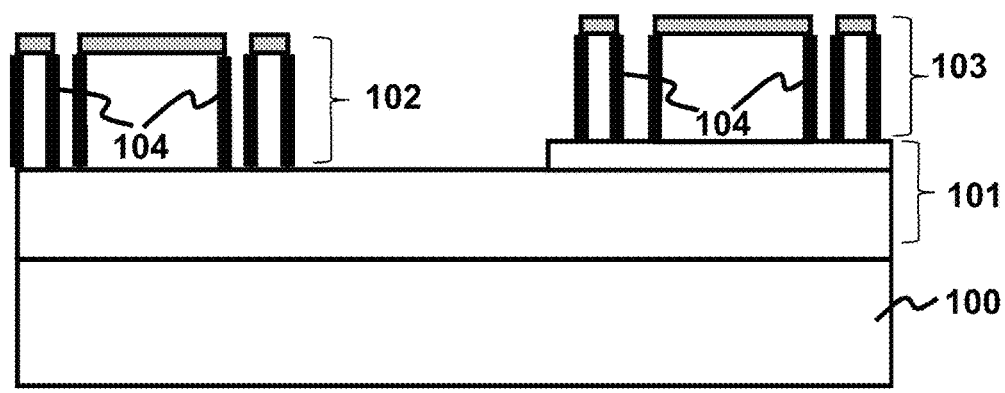
FIG. 2 illustrates a sectional views of a flip-chip LED chip structure according to some embodiments of the present disclosure.
Figure 3:
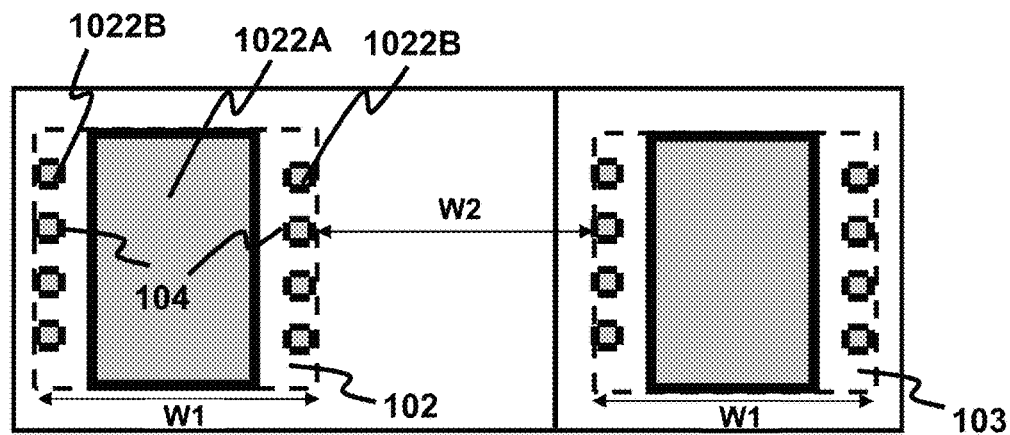
FIG. 3 illustrates a top view of the flip-chip LED chip structure in FIG. 2.

Referring to FIGS. 1-3, a flip-chip LED chip includes a substrate 100; a light-emitting epitaxial layer 101 including an N-type semiconductor layer, a quantum well layer and a P-type semiconductor layer over the substrate 100; an N electrode 102 over the N-type semiconductor layer of the light-emitting epitaxial layer 101; and a P electrode 103 over the P-type semiconductor layer of the light-emitting epitaxial layer 101.

Specifically, the aforesaid substrate 100 can be sapphire, SiC, Si, GaN, AlN or ZnO substrate that is suitable for epitaxial growth. In this embodiment, sapphire is preferred. The light-emitting epitaxial layer 101 is GaN-series material or other materials. the P electrode 103 and the N electrode 102 serve as a bonding electrode structure, which has a metal laminated layer including a bottom layer and an upper surface layer from bottom up in a vertical direction, wherein, the bottom layer structure is easily oxidable metal and the side wall forms an oxide layer, and the upper surface layer is non-oxidable metal. The bonding electrode structure is divided into a main contact portion and a grid-shape portion surrounding the main contact portion at horizontal direction.

Figure 4:
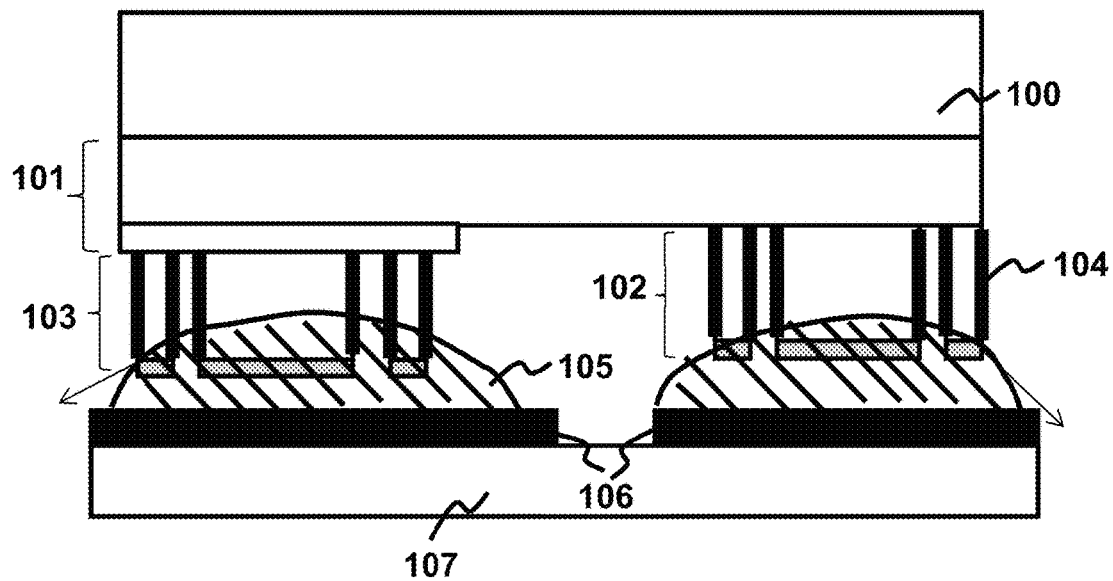
FIG. 4 illustrates a sectional view showing the application of the flip-chip LED chip structure according to some embodiments in the present disclosure for solder paste packaging.

Referring to FIG. 4, the P and N electrodes can be of equivalent areas and symmetrical position. Taking the N-electrode as an example, the N-electrode is divided into a bottom layer (1021A, 1021B) and an upper surface layer (1022A, 1022B) at vertical direction, and is divided into a main contact portion (1021A, 1022A) and a grid-shape portion (1021B, 1022B). The oxidable metal of the bottom layer structure can be Al, Ag, Cu or any of their combinations; the thickness is 2,000 Å~50,000 Å. The side wall of the oxidable metal forms an oxide layer 104. The non-oxidable metal of the upper surface layer can be Cr, Pt, Au or any of their combinations; the thickness is 50 Å-5,000 Å. The upper surface of the main contact portion is used for contact conduction and heat dissipation. The electrode pattern of the grid-shape portion is square, and at least 4 electrodes are provided. In this embodiment, 8 electrodes are preferred, which are distributed at both sides of the main contact layer. The side wall of bottom layer structure of the grid-shape portion forms an oxide layer 104, serving as a barrier wall of the solder paste 105 for packaging, which extends the solder paste downwards along the packaging electrode 106 (over the packaging substrate 107) due to poor adhesiveness to the surface of the solder paste 105 and high surface tension during packaging of the flip-chip LED; this prevents the solder paste 105 from extending to the LED chip end, thus avoiding chip electric leakage and short circuit and improving reliability.

Figure 5:
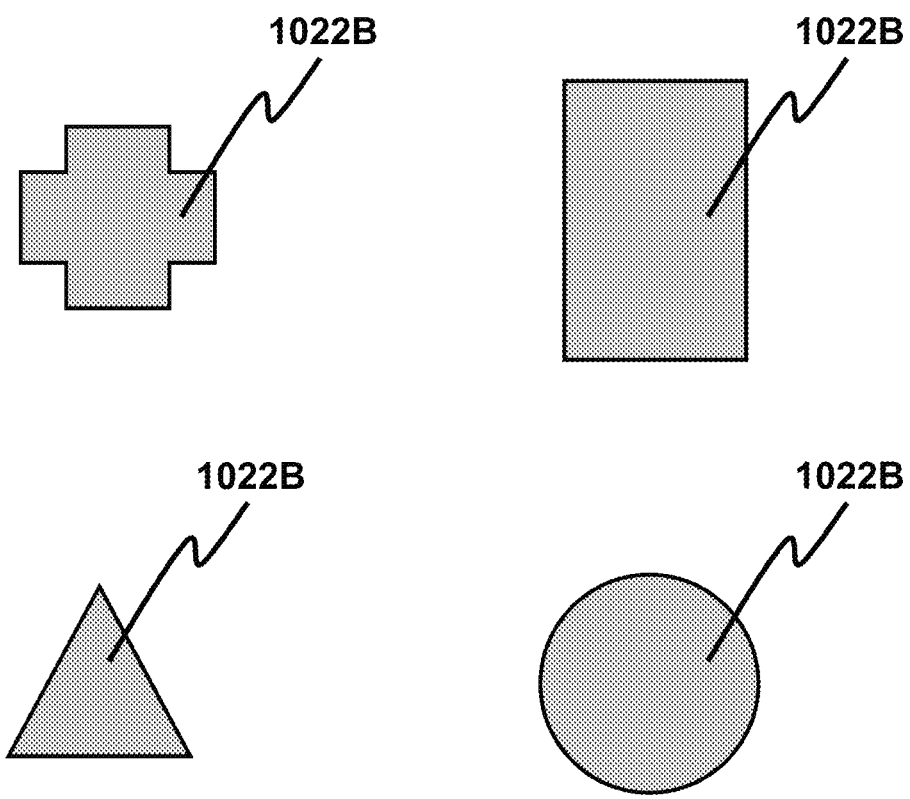
FIG. 5 shows an exemplary horizontal top view of the electrode of the grid-shape portion.

In some embodiments, to further improve the wall barrier effect of the side-wall oxide layer of the bottom structure in the grid portion, the grid portion electrode pattern (such as 1022B) can be changed based on actual chip design, including rectangle, square, circular, oval, rectangle, polygon, cross or any of their combinations, as shown in FIG. 5. In addition, as shown in this embodiment, electrodes in the grid-shape portion are distributed to surround 2 side walls of the main contact portion. It should be noted that, however, electrodes in the grid-shape portion can be distributed to surround each side wall of the main contact portion as required, which is not limited to 2 or 4 side walls.

Referring to FIG. 3, in this embodiment, spacing W2 between the P electrode and the N electrode is larger than 100 μm; the transverse distance W1 of the p electrode and the N electrode is less than 100 μm; i.e., spacing between the P electrode and the N electrode is larger than the transverse distance of the P electrode or the N electrode. Small transverse distance of the electrode saves electrode material, causing the solder paste for packing of the flip-chip LED less likely to be squeezed out. At the meantime, large spacing decrease the chance for mutual diffusion and merging of solder pastes at both sides of the P electrode and the N electrode, and therefore is unlikely to cause short circuit or electric leakage.

The fabrication method for the aforesaid bonding electrode structure of the flip-chip LED chip according to the aforesaid embodiment includes steps below:

First, fabricate a metal laminated layer, and then evaporate or sputter easily oxidable metal Al and non-oxidable metals Cr, Pt and Au, wherein, oxidable metal in the bottom layer structure and non-oxidable metal in the upper surface layer. Divide the bonding electrode structure into a main contact portion and a grid-shape portion surrounding the main contact portion at horizontal direction through yellow light mask process;

Then, take $O_2$ plasma pretreatment for the metal laminated layer, wherein, the upper surface layer is not prone to oxidation, and plasma can clean the surface to improve surface activity, thus forming good contact in the upper surface layer; and the side wall metal of the bottom layer is prone to form an $Al_2O_3$ oxide layer in the effect of $O_2$ plasma.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A bonding electrode structure of a P electrode or an N electrode of a flip-chip LED chip, the bonding electrode structure comprising a metal laminated layer including, from bottom up in a vertical direction:
   a bottom layer; and
   an upper surface layer;
   wherein:
      the bottom layer comprises an oxidable metal having a side wall forming an oxide layer, and the upper surface layer comprises a non-oxidized metal; and
      the bonding electrode structure includes a main contact portion, and a grid-shaped portion surrounding the main contact portion in a horizontal direction.

2. The bonding electrode structure of claim 1, wherein:
the oxide layer is configured to extend a solder paste downwards to a packaging electrode due to poor adhesiveness to a surface of the solder paste and high surface tension during packing of the flip-chip LED chip; so as to prevent the solder paste from extending to an end of the flip-chip LED chip, thereby avoiding chip electric leakage and short circuit and improving reliability.

3. The bonding electrode structure of claim 1, wherein a portion of the upper surface layer over the main contact portion is configured for contact conduction and heat dissipation.

4. The bonding electrode structure of claim 1, wherein the oxide layer forms a barrier wall.

5. The bonding electrode structure of claim 1, wherein at least four electrode parts are provided in the grid-shaped portion.

6. The bonding electrode structure of claim 1, wherein the grid-shaped portion has a pattern comprising at least one of rectangle, square, circular, oval, polygon, or cross.

7. The bonding electrode structure of claim 1, wherein the grid-shaped portion is distributed to surround a side or each side of the main contact portion.

8. The bonding electrode structure of claim 1, wherein the non-oxidized metal comprises at least one of Al, Ag, or Cu.

9. The bonding electrode structure of claim 1, wherein the oxidable metal comprises at least one of Cr, Pt, or Au.

10. A fabrication method for the bonding electrode structure of the P electrode or the N electrode of the flip-chip LED chip according to claim 1, the method comprising:
   1) fabricating the metal laminated layer, comprising the bottom layer and the upper surface layer from the bottom up at the vertical direction; wherein, the bottom layer comprises the oxidable metal and the upper surface layer comprises the non-oxidized metal;
   2) dividing the bonding electrode structure into the main contact portion and the grid-shaped portion surrounding the main contact portion at the horizontal direction; and
   3) performing $O_2$ plasma pretreatment for the metal laminated layer, wherein, the upper surface layer is not prone to oxidation, and $O_2$ plasma cleans the upper surface layer to improve surface activity, thus forming good contact; and the oxidable metal at the side wall of the bottom layer forms the oxide layer after the $O_2$ plasma pretreatment.

11. The fabrication method of claim 10, wherein:
the oxide layer extends a solder paste downwards to a packaging electrode due to poor adhesiveness of the oxide layer to the solder paste surface and high surface tension during packing of the flip-chip LED chip; so as to prevent the solder paste from extending to an end of the flip-chip LED chip, thus avoiding chip electric leakage and short circuit and improving reliability.

12. The fabrication method of claim 10, wherein a portion of the upper surface layer over the main contact portion is configured for contact conduction and heat dissipation.

13. The fabrication method of claim 10, wherein the oxide layer forms a barrier wall.

14. The fabrication method of claim 10, wherein at least four electrode parts are provided in the grid-shaped portion.

15. The fabrication method of claim 10, wherein the grid-shaped portion has a pattern comprising at least one of rectangle, square, circular, oval, polygon, or cross.

16. A flip-chip LED chip, comprising:
a light-emitting epitaxial layer including a first semiconductor layer, a second semiconductor layer, and a quantum well layer between the first and second semiconductor layers;
a P electrode over the second semiconductor layer; and
an N electrode over the first semiconductor layer;
wherein each of the P electrode and the N electrode comprises a bonding electrode structure including a metal laminated layer including from bottom up at a vertical direction:
a bottom layer; and
an upper surface layer;
wherein:
the bottom layer comprises an oxidable metal having a side wall forming an oxide layer, and the upper surface layer comprises a non-oxidized metal; and
the bonding electrode structure has a main contact portion and a grid-shaped portion surrounding the main contact portion at horizontal direction.

17. The flip-chip LED chip of claim 16, wherein:
the oxide layer is configured to extend a solder paste downwards to a packaging electrode due to poor adhesiveness to a surface of the solder paste and high surface tension during packing of the flip-chip LED chip; so as to prevent the solder paste from extending to an end of the flip-chip LED chip, thus avoiding chip electric leakage and short circuit and improving reliability.

18. The flip-chip LED chip of claim 16, wherein spacing between the P electrode and the N electrode is larger than a width of the P electrode or the N electrode.

19. The flip-chip LED chip of claim 16, wherein a portion of the upper surface layer over the main contact portion is configured for contact conduction and heat dissipation.

20. The flip-chip LED chip of claim 16, wherein the oxide layer forms a barrier wall.

* * * * *